United States Patent [19]
Coackley et al.

[11] 3,965,424
[45] June 22, 1976

[54] METHOD AND APPARATUS FOR TRACKING AN INCREMENTALLY SWEEPING GENERATOR BY A FREQUENCY SELECTIVE RECEIVER

[75] Inventors: Robert Coackley; John Reid Urquhart, both of Dalgety Bay, by Dunfermline; David George Dack, Dunfermline, all of Scotland

[73] Assignee: Hewlett-Packard Limited, South Queensferry, Scotland

[22] Filed: Dec. 4, 1974

[21] Appl. No.: 529,673

[30] Foreign Application Priority Data
Dec. 21, 1973 United Kingdom............... 59599/73

[52] U.S. Cl. .................................. 325/363; 325/67
[51] Int. Cl.² ...................................... H04B 17/00
[58] Field of Search ............... 325/67, 363, 63, 470, 325/332–337

[56] References Cited
UNITED STATES PATENTS

| | | | |
|---|---|---|---|
| 3,110,861 | 11/1963 | Hurvitz............................. | 325/335 |
| 3,842,247 | 10/1974 | Anderson............................ | 325/67 |
| 3,895,303 | 7/1975 | Imazeki et al. ..................... | 325/334 |

Primary Examiner—Benedict V. Safourek
Assistant Examiner—Jin F. Ng
Attorney, Agent, or Firm—Patrick J. Barrett

[57] ABSTRACT

A method for tracking an incrementally sweeping generator by a frequency selective receiver is disclosed. A sequence of test signals is generated each of which has a discrete and different frequency which is periodically and incrementally modified according to a program, and the dwell time of each frequency is sufficient to obtain at least two receiver measurements. This sequence of test signals is supplied to a device under test, and the output signals from the device under test are fed to the frequency selected receiver which operates at one of the discrete frequencies supplied according to the program. The operating frequency of the receiver is modified according to the same sweep program and with at least the same sweep rate. The levels of at least two consecutive measurements at the receiver output are compared with at least one reference value which is selected such that it discriminates against other signals that are not part of the sweep program. The receiver frequency is then maintained at a constant value as long as the comparison indicates that the signal level is below the reference level, and the receiver is released to follow the sweep program as long as the comparison indicates that the signal level at the receiver output is equal to or greater than the reference level.

7 Claims, 3 Drawing Figures

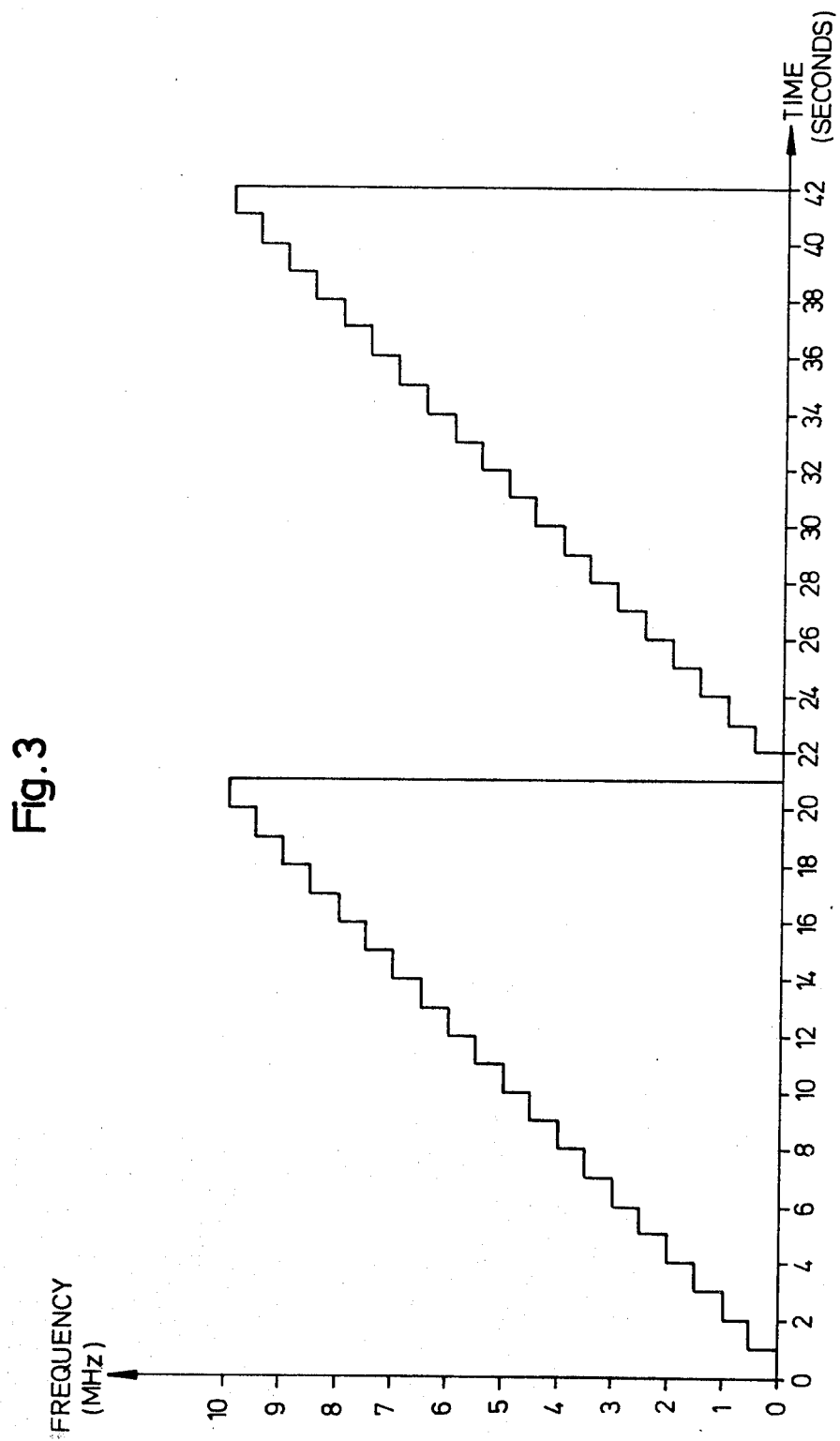

METHOD AND APPARATUS FOR TRACKING AN INCREMENTALLY SWEEPING GENERATOR BY A FREQUENCY SELECTIVE RECEIVER

BACKGROUND OF THE INVENTION

The present invention relates to method and apparatus for tracking an incrementally sweeping generator by a frequency selective receiver. In order to display the frequency response of a network or transmission line it is customary to arrange for a generator to sweep through the frequency range of interest and either use a broadband receiver to display the output or synchronously tune a selective receiver. Thermal noise or other signals, in the network under test limit the dynamic range of the measurement when a broadband receiver is used. Thus synchronous tuning of a selective receiver is preferred.

The latter may be achieved by careful arrangement of a voltage tuned oscillator being tuned by the same sweep signal that is used to tune the generator. Alternatively the output of one or more reference signals from the generator may be used to ensure that the receiver input is always tuned to the generator output frequency. Of course this process may be reversed in that reference signals from the receiver may be used to ensure that the generator is synchronously tuned. This arrangement is commonly known as a "tracking generator." Examples of arrangements as described above are disclosed in the Hewlett-Packard Application Note 150-3 published August 1972. The general problem of such arrangements is that generator and receiver must be connected by at least one additional signal channel parallel to the network or transmission line under test.

A similar problem arises when it is desired to use a frequency synthesizer as a generator and to use a second frequency synthesizer as the local oscillator in the receiver. When the receiver and generator are physically close then it is possible to devise a common oscillator scheme for synchronous tuning and indeed it is possible to arrange for programming of the two synthesizers even when receiver and generator are separated, by use of a two-way data channel which is used on a "handshake" basis to ensure synchronous sweeping.

Sometimes it is not convenient to provide the separate data channel such as when the distance involved is many miles as in the case of telephone systems when a modem would have to be used and involves the use of serial data so that parallel to serial conversion may become necessary.

One possible solution to this is to arrange for the generator and receiver to step at a precise rate by the use of two identical clock frequencies, so that synchronism is maintained. However, in order to ensure good measurements it is essential to trigger both devices at the same instant and to allow sufficient time at each measurement frequency for both the network under test and the receiver circuits to settle. This normally means that the sweep rate is unnecessarily slow, which is a particular disadvantage of conventional methods of filter testing. Such methods use a constant sweep rate which must be chosen less than or equal to the rate necessary to measure correctly the fastest changing regions of the characteristic of the network under test. This means that the regions of slow change are measured at a rate less than is necessary. Furthermore, the conventional arrangements suffer the disadvantage that if a loss of synchronism occurs, then the system cannot automatically re-lock.

SUMMARY OF THE INVENTION

It is an object of the present invention to provide a method for tracking a sweeping generator by a frequency selective receiver that avoids an additional signal channel between generator and receiver parallel to the network or line under test.

Another object of the invention is to provide a frequency selective tracking receiver system that avoids an additional signal channel between generator and receiver parallel to the network or line under test.

A further object of the invention is to allow a quicker measurement particularly of the transmission characteristics of filters.

According to a preferred embodiment of the present invention a method is provided for tracking an incrementally sweeping generator by a frequency selective receiver includng the steps of: generating a sequence of test signals each of which has a discrete and different frequency which is periodically and incrementally modified according to a program, where the dwell time on each frequency is sufficient to obtain at least two receiver output levels; supplying said sequence of test signals to a device under test; feeding the output signals from the device under test to the frequency selected receiver operating at one of the discrete frequencies supplied according to the program; modifying the operating frequency of the receiver according to the same sweep program and with at least the same sweep rate; comparing the levels of at least two consecutive measurements at the receiver output with at least one reference value which is selected such that it discriminates against other signals that are not part of the sweep program, maintaining the receiver frequency at a constant value as long as the comparison indicates that the signal level is below the reference level; and releasing the receiver to follow the sweep program as long as the comparison indicates that the signal level at the receiver output is equal to or greater than the reference level.

Preferably a level difference value is defined which is selected to discriminate against unstable measurements and the receiver frequency is only allowed to follow the sweep program if, and as long as the difference between two or more consecutive receiver output levels is within the difference range defined. Thus a sweep rate is chosen which is appropriate to each region of the characteristic of the network under test and so provides a faster overall measurement.

Also according to a preferred embodiment of the present invention a frequency selective tracking receiver system is provided including a device for incrementally and periodically sweeping the receiver frequency according to a certain sweep program with a given minimum sweep rate, a comparator having one input connected to the receiver output, having another input connected to a source of a first reference potential which is selected to discriminate against signals different from those in the allowed sweep program and having an output connected to the frequency sweeping device to deliver an inhibit signal maintaining the generated frequency and the receiver frequency at a constant value if and as long as the level comparison between at least two consecutive signals indicates that the level measured is below the reference provided.

The selective tracking receiver system may comprise means for subtracting the two or more consecutive measurements and for showing the difference in level between each measurement; and may comprise means for comparing the difference with an allowed value to define the stability and repeatability of measurements, the output of such comparing means being connected to the frequency sweeping device to deliver an inhibit signal maintaining the generated frequency and the receiver frequency at a constant value if and as long as the level comparison between at least two consecutive signals indicates that the difference is greater than the allowed variation.

BRIEF DESCRIPTION OF THE DRAWINGS

FIG. 3 is a frequency/time diagram showing the sweep program as employed in the arrangement of FIG. 1.

DESCRIPTION OF THE PREFERRED EMBODIMENT

Figure 1:
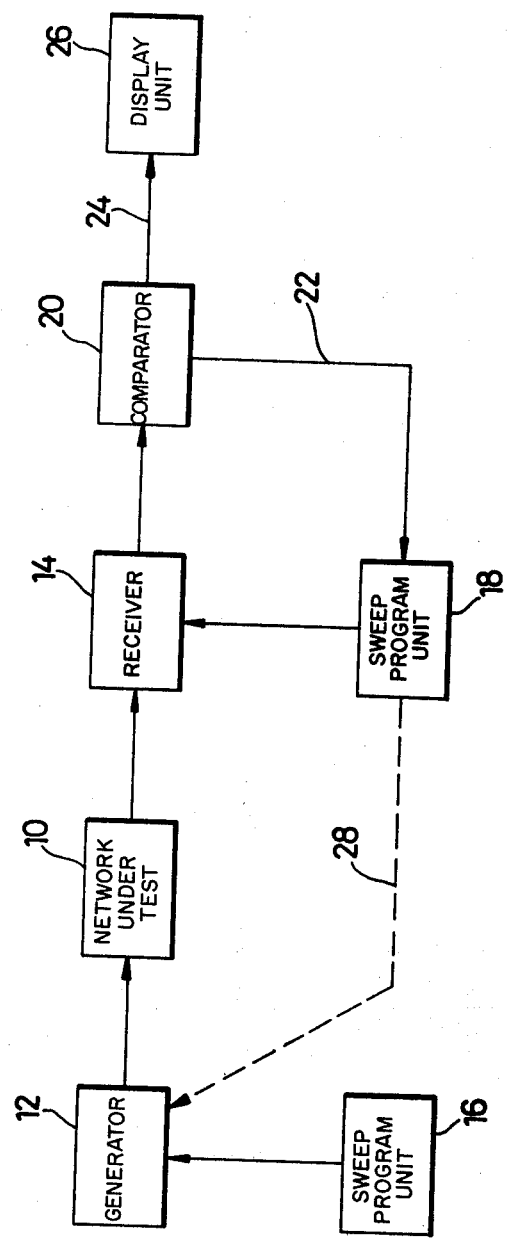
FIG. 1 is a block diagram of an arrangement for performing the tracking method according to a preferred embodiment of the present invention.

Referring to FIG. 1, a network under test 10 is connected with its input to an incrementally frequency sweeping generator 12 (e.g. a Hewlett-Packard Model 8660 generator) and is connected with its output to a frequency selective receiver 14 (e.g. a Hewlett-Packard Model 3040 receiver). The frequency sweeps of both the generator 12 and the receiver 14 are driven by sweep program units 16 and 18 respectively. Every suitable program unit may be used for this purpose, e.g. units delivering incrementally swept voltages at their outputs if generator 12 and receiver 14 are voltage tuned. The sweep program of sweep program units 16 and 18 are identical. The sweeping rates $R_1$ and $R_2$ of sweep program units 16 and 18, respectively, however, are different with $R_2 > R_1$.

A typical sweep program is shown in FIG. 3 representing the generator frequency dependent on the time. The sweep width shown there is 10 MHz, however, other sweep widths may be used, too, for example in the range from 10 kHz to 25 MHz. The frequency increment in the present embodiment is 500 kHz but can be any value in excess of preferably 10 Hz for the illustrated embodiment. The dwell time is typically 1 second. The sweep rate depends on the frequency increment and on the sweep width. In the embodiment shown the sweep rate is 0.05 Hz. The dwell time at each frequency is long enough to allow at least two successive measurements to be made with the required repeatability.

A comparator 20 (e.g. a suitable programmed calculator such as a Hewlett-Packard Model 9820 or 9830 Programmable Calculator) is provided in order to test for repeatable measurements which are above a selected threshold as described below in more detail. The comparator 20 has an input connected to the output of the receiver 14 and comprises two outputs 22 and 24 connected to a display unit 26 and the sweep program unit 18 respectively. Connection of a Programmable Calculator such as the Hewlett-Packard Model 9820 to an instrument such as receiver 14 is discussed in greater detail in U.S. Pat. No. 3,839,630, in the *Hewlett-Packard Journal*, Vol. 24, No. 2, October 1972, and in the Hewlett-Packard 9820A Calculator 11224A Peripheral Control II Operating Manual.

Briefly, the calculator described in U.S. Pat. No. 3,839,630 is shown in block diagram form in FIGS. 3A and 3B thereof. As can be seen in FIG. 3B, the input/output (I/O) portion of the calculator includes a peripheral control 66 for devices external to the calculator, such as receiver 14 and display unit 26 herein, as indicated in column 12, lines 10–31 of the patent. The portion of the calculator memory allocated to peripheral functions is illustrated in the memory map of FIG. 4B by the portions labeled as Option Blocks numbers 1, 2 and 3 and referred to in the text at column 12, lines 62 and following.

Figure 2:
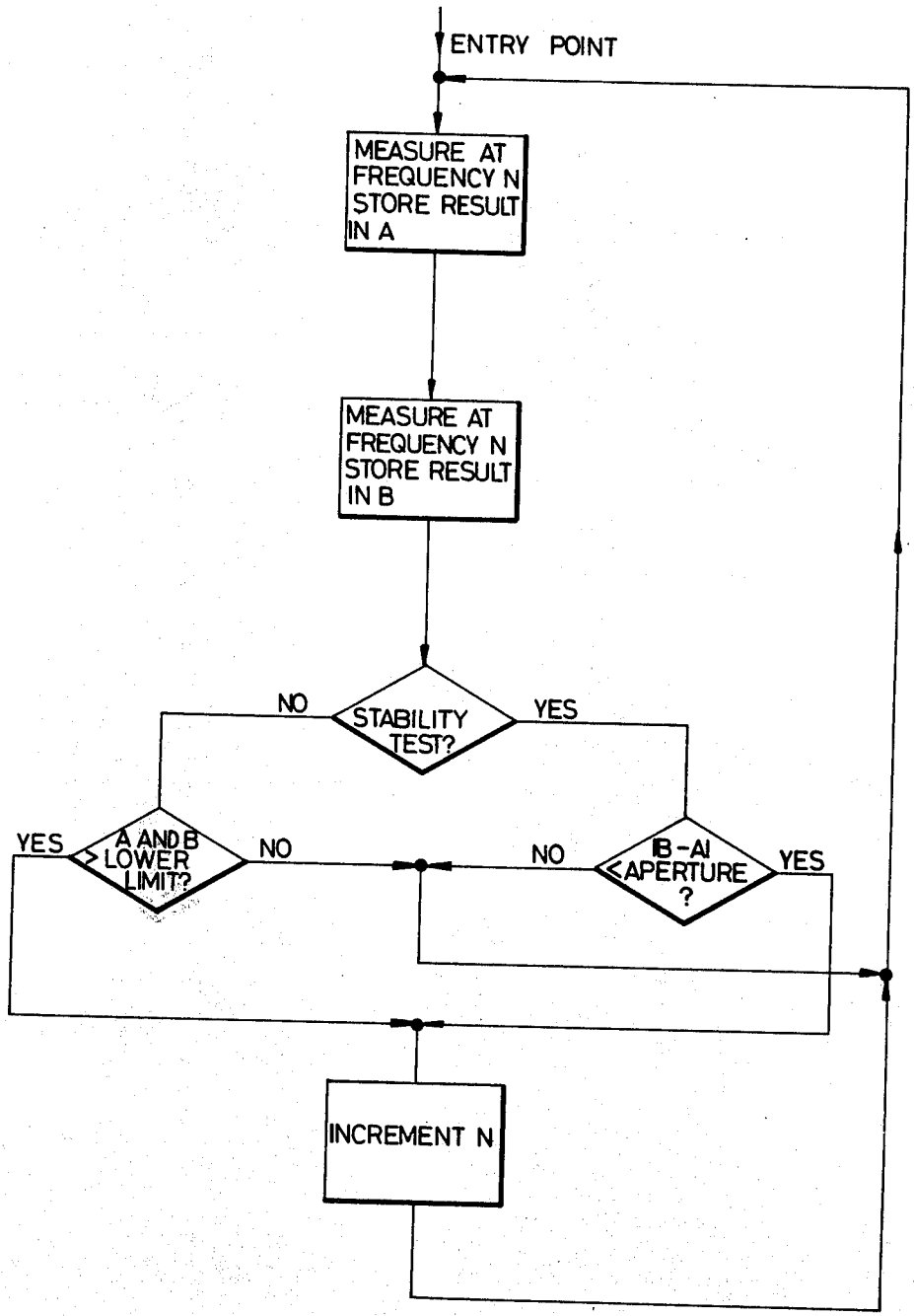
FIG. 2 is a flow chart of the tracking method as performed with the arrangement according to FIG. 1.

Peripheral control plug in Read Only Memories (ROM's) and their location in the calculator are shown pictorially in FIGS. 9 and 7 respectively, while the interconnection cables and connectors are shown in FIG. 2. Further detailed description of peripheral I/O control is given starting at column 21, line 34 through the following column; and the peripheral control ROM's, at column 24, line 29 and following. For additional detail, the reader is referred to columns 261 to 309, column 415 and following, and FIG. 67. Details of the operation of the calculator with information provided via the I/O portion of the calculator may be found in the remaining text of the referenced patent.

The comparator 20 is capable of performing the following tests in order to decide whether the receiver is tracking the generator sweep correctly:

a. A stability test to ensure that the measured level is stable within a defined level range for two or more consecutive measurements. In general two repeatable measurements will be sufficient to show that the network 10 and/or receiver 14 have settled. For example a single frequency measurement could be defined as "good" if two consecutive measurements agreed to an accuracy of 0.1 dB. However, for certain noise conditions this "aperture" may have to be widened.

b. A level test to ensure that a signal is being measured whose level exceeds that of other unwanted spurious or noise signals which may be due to the receiver 14 and/or the network 10. For example a single frequency measurement may be defined as "good" if one or more consecutive measurements at this frequency were above a fixed threshold or limit of say −40 dBm at a level measuring point of −20 dBm.

The aperture and the threshold may be fixed or defined externally by keys of other programming methods. For example, if a programmable calculator is used as a comparator, the threshold value may be entered and stored in the calculator as a numerical constant against which the measured value from receiver 14 is compared. Likewise the aperture value may be entered and stored as a numerical constant for comparison with the absolute value of the difference between two successive measurements. If these conditions are not met then the comparator 20 stops the sweep program of the receiver 14 by means of an inhibit signal at output 22 fed to unit 18 until said conditions are met. In this way, if a loss of signal occurs for any reason, then the receiver 14 will wait for the next sweep of the generator 12 and will automatically "re-lock" to it. When the conditions are met the receiver 14 steps to the next frequency. The measurement at the frequency where the conditions are met is then given to the output 24 and may be displayed by the display 26 or recorded by a plotter, for example. The receiver's speed of measurement must be equal to or greater than twice the stepping speed of the generator in order to allow tracking the generator sweeps since the receiver makes at least two measurements at each frequency. It can be seen that the arrangement according to the invention is essentially an asynchronous system in which the receiver is capable of stepping at a rate faster than the generator.

The feature of automatic acquisition obviates the need for simultaneous triggering of the generator 12 and the receiver 14. Furthermore it provides a very important facility which can be employed in a synchronous stepping mode. Under these conditions the generator 12 and the receiver 14 step synchronously by means of a programming link as indicated by the dotted line 28 in FIG. 1. The sweep program unit 16 is then omitted and only one sweep program (unit 18) is used. The stepping sequence is inhibited if the above-described stability test condition is not satisfied. In this way the generator 12 and the receiver 14 will stay at any necessary frequency until the network under test has settled for the stability condition to be met. This is particularly important for testing filters.

A flow chart of the tracking method described above is shown in FIG. 2. A measurement cycle begins at the point in the flow chart labeled ENTRY POINT. The particular frequency at which a measurement is being made is denoted as N and when the first measurement is made by the receiver, the measured value is stored for comparison with a second measured value. This first measured value may be stored in a first register or memory in comparator 20 labeled A. In a like manner the receiver makes a second measurement at frequency N and this measured value may be stored in a second register or memory in comparator 20 labeled B. The operator may then decide whether he wishes to perform a stability test as described in paragraph a above or a level test as described in paragraph b. The particular test to be performed may be chosen beforehand by appropriate setting of the controls on comparator 20.

If the stability test is chosen, the comparator determines the absolute value of the difference between the first and second measured values, shown as |B–A| in the drawing, and compares this difference value with the selected aperture value. If the difference value is less than the aperture value, the comparator outputs a signal to sweep program unit 18 to increment the frequency N to the next higher value, since the stability test has been satisfied. However, if the difference value is greater than the aperture value, then the measurement cycle is reinitiated at the ENTRY POINT to continue making measurements at frequency N until the stability test is met.

If the level test is selected, the first and second measured values are each compared with a selected lower limit. If the values are greater than the lower limit, comparator 20 gives an output signal to sweep program unit 18 to increment the frequency N to the next higher value. If the measured values are less than the lower limit, then measurement cycle is reinitiated at the ENTRY POINT to make another set of measurements at frequency N.

It is also possible to have the comparator make both the level test and the stability test simultaneously. In this case comparator 20 will give an output signal to sweep program unit 18 to cause incrementing to the next frequency only if both tests are met, i.e. both measured values are greater than the lower limit and the difference between the values is less than the aperture. It is possible to use the system in a way that the program unit of the receiver may drive a subsequent transmitter/receiver pair of measurements on cascaded networks.

We claim:
1. A method of tracking a sweeping generator with a frequency selective receiver tunable to a plurality of frequencies comprising the steps of:
   receiving and measuring the level of a signal with the receiver by making at least two successive level measurements at one frequency to which the receiver is tuned;
   providing a predetermined reference signal condition by establishing a predetermined signal level aperture;
   comparing the measured signal against the predetermined reference signal condition by determining the level difference between two of the successive level measurements and comparing the level difference with the predetermined signal level aperture; and
   tuning the receiver to another of the plurality of frequencies when the level difference is less than the predetermined signal level aperture.

2. A method of tracking a sweeping generator with a frequency selective receiver tunable to a plurality of frequencies comprising the steps of:
   generating a sequence of test signals, each of which has a discrete and different frequency which is periodically and incrementally modified according to a generator sweep program;
   supplying the sequence of test signals to a device under test;
   feeding output signals from the device under test to the receiver;
   providing a receiver sweep program for causing the receiver to be tuned to the same sequence of frequencies as the generator sweep program, receiving and measuring the level of said output signals with the receiver; providing a predetermined reference signal condition; comparing the measured signals against the predetermined reference signal condition; tuning the receiver to another of the plurality of frequencies when a measured signal level has a predetermined relationship to the predetermined reference signal condition, wherein the step of tuning the receiver includes releasing the receiver to follow the receiver sweep program when the measured signal level has the predetermined relationship to the predetermined reference signal condition.

3. An apparatus for tracking a sweeping signal generator which is sweeping according to a predetermined sweep program, the apparatus comprising:
   a frequency selective receiver that can be tuned to a plurality of frequencies for measuring and indicating at an output thereof the level of received signals;
   sweep program unit means connected to the receiver for tuning the receiver according to the predetermined sweep program;
   reference means for establishing a predetermined reference signal condition;

a comparator connected to the receiver output, the reference means, and the sweep program unit means for comparing the level of received signals with the reference signal condition for inhibiting tuning of the receiver by the sweep program unit means until the level of received signals has a predetermined relationship with the predetermined reference signal condition.

4. An apparatus as in claim 3 wherein:

the predetermined reference signal condition comprises a predetermined reference level; and the comparator compares the level of received signals with the predetermined reference level and inhibits the tuning of the receiver when the level of received signals is lower than the predetermined reference level.

5. An apparatus as in claim 3 wherein:

the predetermined reference signal condition comprises a predetermined signal level aperture; and the comparator determines the level difference between two successively measured levels of received signals, compares the level difference with the predetermined signal level aperture, and inhibits the tuning of the receiver when the level difference is greater than the predetermined signal level aperture.

6. An apparatus as in claim 5 wherein:

the predetermined reference signal condition additionally comprises a predetermined reference level; and the comparator also compares the level of received signals with the predetermined reference level and inhibits the tuning of the receiver unless the level difference is greater than the predetermined signal level aperture and the measured level of at least one of the received signals is greater than the predetermined reference level.

7. An apparatus as in claim 6 wherein the predetermined reference level and signal level aperture are selectable by a user of the apparatus.

* * * * *